United States Patent
Seidman et al.

(10) Patent No.: US 11,056,444 B2
(45) Date of Patent: Jul. 6, 2021

(54) SURFACE-MOUNT THIN-FILM COMPONENTS HAVING TERMINALS CONFIGURED FOR VISUAL INSPECTION

(71) Applicant: AVX Corporation, Fountain Inn, SC (US)

(72) Inventors: Yehuda Seidman, Jerusalem (IL); Elinor O'Neill, Jerusalem (IL); Dan Rozbroj, Modra (CZ)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/655,280

(22) Filed: Oct. 17, 2019

(65) Prior Publication Data

US 2020/0144201 A1 May 7, 2020

Related U.S. Application Data

(60) Provisional application No. 62/756,808, filed on Nov. 7, 2018.

(51) Int. Cl.
*H01L 23/00* (2006.01)
*H01L 23/498* (2006.01)
(Continued)

(52) U.S. Cl.
CPC ...... *H01L 23/562* (2013.01); *H01L 21/76853* (2013.01); *H01L 23/49805* (2013.01);
(Continued)

(58) Field of Classification Search
CPC ............. H01L 23/562; H01L 23/49805; H01L 23/49838; H01L 23/49866; H01L 23/64; H01L 21/76853
(Continued)

(56) References Cited

U.S. PATENT DOCUMENTS

| 5,194,137 A | 3/1993 | Moore et al. |
| 5,453,726 A | 9/1995 | Montgomery |

(Continued)

FOREIGN PATENT DOCUMENTS

JP     6184388 B2     8/2017

OTHER PUBLICATIONS

International Search Report and Written Opinion for PCT/US2019/056654 dated Feb. 7, 2020, 11 pages.

*Primary Examiner* — Tong-Ho Kim

(74) *Attorney, Agent, or Firm* — Dority & Manning, P.A.

(57) ABSTRACT

A surface-mountable component is disclosed. The surface-mountable component may include a substrate having a side surface and a top surface that is perpendicular to the side surface. The component may include an element layer formed on the top surface of the substrate. The element layer may include a thin-film element and a contact pad electrically connected with the thin-film element. The contact pad may extend to the side surface of the substrate. The component may include a terminal that is electrically connected with the contact pad at a connection area. The connection area may be parallel with the top surface of the substrate. The terminal may have a visible edge surface that is approximately aligned with the side surface of the substrate. The visible edge surface may be visible for inspection when the surface-mountable component is mounted to a mounting surface.

25 Claims, 6 Drawing Sheets

(51) Int. Cl.
*H01L 23/64* (2006.01)
*H01L 21/768* (2006.01)

(52) U.S. Cl.
CPC .. *H01L 23/49838* (2013.01); *H01L 23/49866* (2013.01); *H01L 23/64* (2013.01)

(58) Field of Classification Search
USPC ........................................................ 257/741
See application file for complete search history.

(56) References Cited

U.S. PATENT DOCUMENTS

| | | | |
|---|---|---|---|
| 5,828,128 | A | 10/1998 | Higashiguchi et al. |
| 8,059,420 | B2 | 11/2011 | Nishizawa |
| 9,078,358 | B2 | 7/2015 | Toratani et al. |
| 9,847,203 | B2 | 12/2017 | Goldstein et al. |
| 2007/0274055 | A1* | 11/2007 | Nishizawa ............. H01G 2/065 361/761 |
| 2012/0092123 | A1* | 4/2012 | Goldstein .......... H01H 85/0411 337/187 |
| 2017/0178797 | A1 | 6/2017 | Todorov |
| 2017/0278762 | A1 | 9/2017 | Kessler et al. |

* cited by examiner

SURFACE-MOUNT THIN-FILM COMPONENTS HAVING TERMINALS CONFIGURED FOR VISUAL INSPECTION

CROSS REFERENCE TO RELATED APPLICATION

The present application claims filing benefit of U.S. Provisional Patent Application Ser. No. 62/756,808 having a filing date of Nov. 7, 2018, which is incorporated herein by reference in its entirety.

FIELD OF THE INVENTION

The present subject matter relates generally to surface-mount, thin-film components, and particularly to an improved termination for surface-mount, thin-film components that facilitates visual inspection of mounting connections to a mounting surface.

BACKGROUND OF THE INVENTION

Surface mounting has become a preferred technique for circuit board assembly. As a consequence, virtually all types of electronic components have been or are being redesigned for surface mount (i.e., leadless) embodiments or applications. The rapid incorporation of surface mount devices (SMD) into all types of electronic circuits has created a corresponding need for SMD thin-film components, such as fuses, filters, resistors, etc.

However, thin-film surface-mount devices often have terminals that are hidden beneath the component when mounted to a mounting surface, such as a printed circuit board. As a result, X-ray inspection is often required to assess the quality of the connections (e.g., solder connections) between the terminals and the mounting surface. Additionally, when such thin-film surface-mount devices are subjected to stresses, for example from thermal cycling, the terminals may be become disconnected from the thin-film element and/or become disconnected from the mounting surface.

SUMMARY

In accordance with one embodiment of the present disclosure, a surface-mountable component may include a substrate having a side surface and a top surface that is perpendicular to the side surface. The component may include an element layer formed on the top surface of the substrate. The element layer may include a thin-film element and a contact pad electrically connected with the thin-film element. The contact pad may extend to the side surface of the substrate. The component may include a terminal that is electrically connected with the contact pad at a connection area. The connection area may be parallel with the top surface of the substrate. The terminal may have a visible edge surface that is approximately aligned with the side surface of the substrate.

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which.

Figure 1:
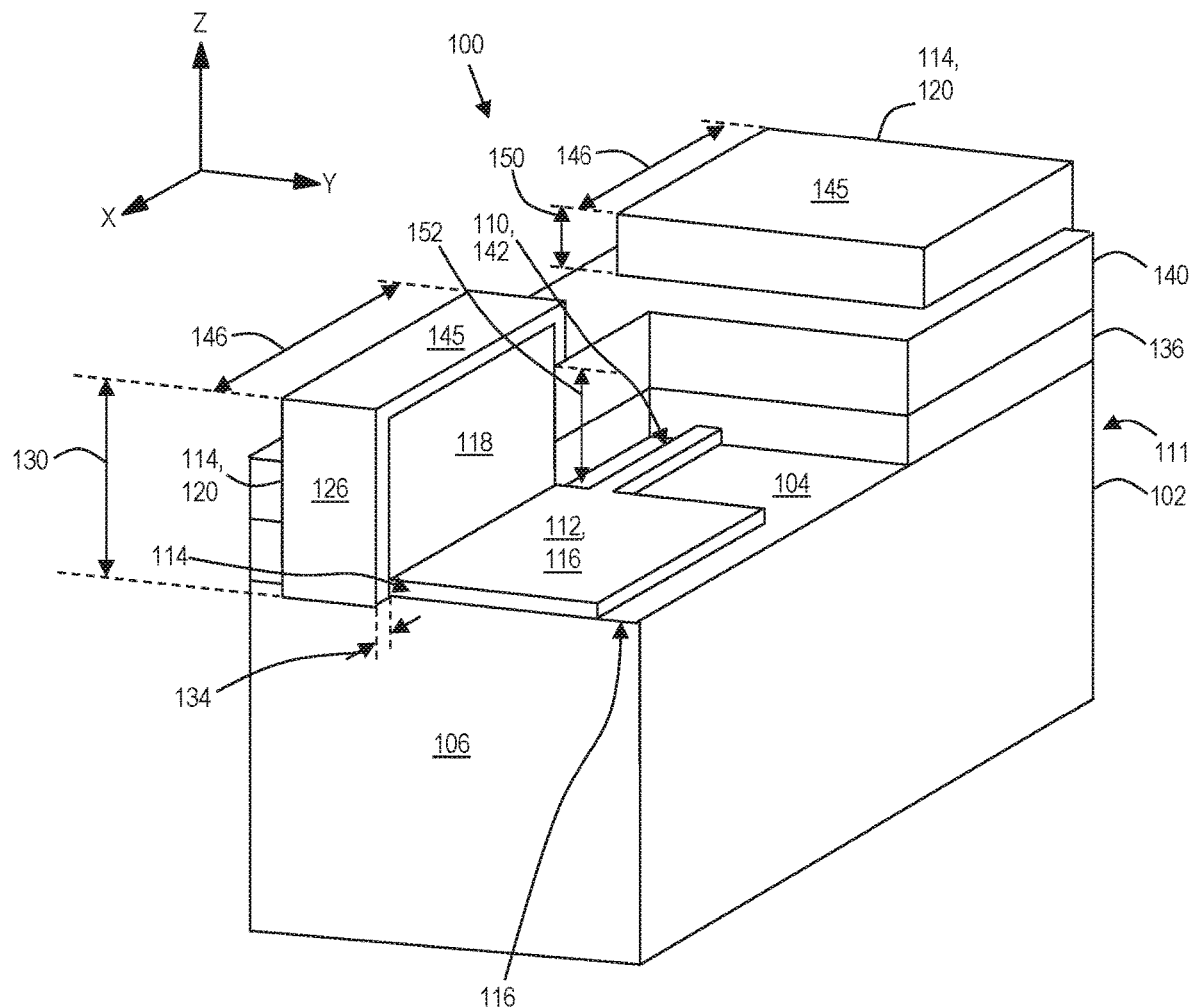
FIG. 1 illustrates a cutaway perspective view of an embodiment of a surface-mountable thin-film component according to aspects of the present disclosure.

Repeat use of reference characters throughout the present specification and appended drawings is intended to represent same or analogous features, steps, or other elements of the present technology.

DETAILED DESCRIPTION OF REPRESENTATIVE EMBODIMENTS

It is to be understood by one skilled in the art that the present disclosure is a description of exemplary embodiments only, and is not intended as limiting the broader aspects of the present subject matter, which broader aspects are embodied in the exemplary constructions.

Generally, the present disclosure is directed to a surface-mountable component including a thin-film element. The surface-mountable component may include terminals. The terminals may be arranged to permit visual inspection of solder connections between the terminals and a surface to which the component is mounted, such as a printed circuit board. The terminals may include visible edge surfaces that are arranged proximate a side surface of the substrate of the component such that a connection (e.g., solder connection) between the visible edge surfaces and the printed circuit board may be visually inspected after the component is mounted to a mounting surface, such as a printed circuit board.

The component may also be resilient against stresses, such as thermal stress or mechanical stress (e.g., bending, flexing, etc.). The terminals may be connected with the element layer in a manner that provides improved strength and robustness, preventing separation of the terminals from the element layer, which may include the thin-film element. The terminals may also include large areas for mounting the component with the mounting surface. This may provide increased strength and robustness against separation of the terminals from the mounting surface from thermal or mechanical stresses.

The component may include a substrate formed from a variety of materials such as glass, ceramic (e.g., alumina, sapphire or other ceramic), silicon (Si), polymeric substrate materials with suitable thermal properties (with or without suitable passivation layers) or glass-ceramic material.

The element layer may be formed on the top surface of the substrate. The element layer may include a thin-film element. The thin-film element may be configured for a variety of functions. As examples, the thin-film element may be or include at least one of an inductor, capacitor, coupler, strip line, resistor, or a fuse. For example, in some embodiments, the thin-film element may be or include a thin-film fuse that includes a fuse track.

In some embodiments, multiple element layers may be employed to form more complex components, such as filters. Additional element layers may be separated by additional passivation, protection, and/or dielectric layers. The various element layers may be patterned and electrically connected (e.g., using vias) to form a circuit. The dielectric layer(s) may include a variety of suitable materials. For example, the dielectric materials may include ceramic, semi-conductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics (e.g., benzocyclobutene (BCB), polyimide, etc.). In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In such examples, the dielectric material may have a dielectric constant that is greater than 100, for example within a range from between about 100 to about 4000, in some embodiments from about 1000 to about 3000.

The element layer, which may include the thin-film element, may be formed using a variety of suitable techniques. Examples of techniques that may be employed include chemical deposition (e.g., chemical vapor deposition), physical deposition (e.g., sputtering), or any other suitable deposition technique for forming thin-film elements. Additional examples include any suitable patterning technique (e.g., photolithography), etching, and any other suitable subtractive technique for forming thin-film elements.

The element layer, which may include a thin-film element, may be or include a variety of suitable materials. For example, a variety of metals may be used, including copper, which has high conductivity and ductility. In some embodiments, the thin-film element may be or include nickel (Ni). Nickel may be particularly suited for forming very low current thin-film fuses. For example, without wishing to be bound by theory, nickel shows a steep increase in electrical resistivity with temperature. It is believed that this is due to its ferromagnetic characteristics. In some embodiments, other magnetic metals (Co, Fe and/or alloys thereof) may be used. The element layer may comprise one or metals that demonstrate relatively low Joule heating and high resistance to electro-migration and other diffusion and thermally activated degradation processes. Nickel and Cobalt also have high ductility and resistance to corrosion in air, water and chlorides which provide reliable operation even in humid, mildly corrosive environments. It should be understood, however, that other metals with appropriate resistance/melting points may also be employed.

In some embodiments, the thin-film element may be or include a resistor. The thin-film element may include a resistive layer, which may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials.

In some embodiments, the thin-film element may be or include a capacitor and/or filter. In such embodiments, the thin-film element may include a dielectric material. A variety of dielectric materials may be suitable, including silicon oxynitride, silicon nitride, silicon oxide (e.g., silicon dioxide), barium titanate, strontium titanate, strontium barium titanate, bismuth strontium tantalate, tantalum, niobium, oxides or nitrides or such materials, NPO (COG), X7R, X7S, Z5U, Y5V formulations, lead-based materials such as doped or non-doped PZT dielectrics, and others.

The thickness of the element layer, which may include the thin-film element, may vary. For example, in some embodiments thickness of the element layer may range from about 0.0375 micrometers (microns) to about 40 microns, in some embodiments from about 0.1 microns to about 10 microns, in some embodiments from about 0.2 microns to about 4 microns in some embodiments from about 0.4 microns to about 1 micron.

In some embodiments, the component may include at least one adhesion layer formed over and/or beneath the element layer. The adhesion layer may be or include a variety of materials that are suitable for improving adhesion between the element layer and adjacent layers. For example, the adhesion layer may include at least one of Ta, Cr, TaN, TiW, Ti, or TiN. For example, in some embodiments, the adhesive layer may be or include tantalum (Ta) (e.g., tantalum or an oxide or nitride thereof) and may be formed between the element layer and substrate to improve adhesion. As another example, in some embodiments, the adhesion layer may be formed over the element layer and beneath a passivation layer, which is described in greater detail below. Without being bound by theory, the material of the adhesion layer may be selected to overcome phenomena such as lattice mismatch and residual stresses.

The adhesion layer(s) may have a variety of suitable thicknesses. For example, in some embodiments, the thickness of an adhesion layer may range from about 100 angstroms to about 1000 angstroms, in some embodiments from about 200 angstroms to about 800 angstroms, in some embodiments from about 400 angstroms to about 600 angstroms.

In some embodiments, the component may be configured as a surface-mount thin-film fuse. The thin-film element may include a fuse track. The fuse track may be connected between two terminals. In some embodiments, the fuse track may be generally straight. It should also be appreciated that other configurations are possible, for example, where additional length is required or desirable. As examples, in some embodiments, the fuse track may be curved, may zig-zag, or may have a sinusoidal shape.

The fuse track may be configured to "fail" or "blow" (e.g., stop electrically connecting the terminals together) when a current flows through the fuse track that is over a maximum current. The maximum current may be related to the rated current of the fuse component. For example, the threshold current may be about 250% of the rated current.

In some embodiments, the component may include one or more passivation layers formed over at least a portion of the element layer. The passivation layer may be formed from a variety of suitable materials, including polymer materials. For example, in some embodiments, the passivation layer may be or include polyimide. In some embodiments, the passivation layer(s) may include at least one of silicon oxynitride, $Al_2O_3$, $SiO_2$, $Si_3N_4$, benzocyclobutene, or glass.

The surface-mountable component may include at least one terminal. In some embodiments the component may include a pair of terminals. Each of the terminals may be arranged on an opposite end of the component. In other embodiments, the component may include greater than two terminals. For example, in some embodiments the number of terminals may range from 2 to 12, or more, in some embodiments from 2 to 10, and in some embodiments from 2 to 8. The terminals may be arranged symmetrically about a longitudinal centerline, a lateral centerline, or both. For example, the component may include 2 terminals on each side, 3 terminals on each side, 4 terminals on each side, or more.

The terminal(s) may be generally formed by electroplating. However, the terminal(s) may be formed by any suitable technique including chemical deposition (e.g., chemical vapor deposition), physical deposition (e.g., sputtering) or any other suitable technique.

In some embodiments, the terminals may include a first layer of a conductive material. The first layer of conductive material may be or include copper. In other embodiments, the first layer of conductive material may be or include a variety of other suitable materials, such as gold, silver, platinum, nickel, copper, steel, or combination thereof.

In some embodiments, the terminal may include additional layers formed over the first layer. For example, a second layer formed over the first layer. In some embodiments, a third layer may be formed over the second layer. The second and/or third layers may be termination layers and may comprise a solderable conductive material. In some embodiments, the second layer may be or include nickel. The third layer may be or include tin. It should be understood that the second and/or third layers alternatively may be or include tin, nickel, lead, or mixtures thereof. In other embodiments, however, the terminals may be free of any additional layers formed over the first layer. In such embodiments, each terminal may consist of a single layer.

A thickness in the Z-direction of the first layer of the terminal may range from about 10 microns to about 200 microns, in some embodiments from about 15 microns to about 100 microns, in some embodiments from about 15 microns to about 80 microns, and in some embodiments from about 20 microns to about 60 microns.

A thickness in the Z-direction of the second layer of the terminal may range from about 1 micron to about 30 microns, in some embodiments from about 2 microns to about 20 microns, in some embodiments from about 3 microns to about 15 microns, in some embodiments from about 4 microns to about 10 microns, e.g., about 7 microns.

An overall thickness in the Z-direction of the terminal (e.g., including both the first layer and any subsequent layers, if present) may preferably range from about 15 microns to about 60 microns, and in some embodiments from about 20 microns to about 40 microns.

Regardless of the particular configuration employed, the present inventors have discovered that through selective control over the shape and arrangement of the terminals and element layer, a surface mountable component that includes a thin-film element may be achieved that permits visual inspection of connections (e.g., solder connections) between the terminals and a surface to which the component is mounted, such as a printed circuit board. The surface mountable component may also provide improved resilience against thermal stresses caused by changes in temperature and/or mechanical stresses caused by bending or flexing of the component.

The terminal may be formed such that an edge surface of the terminal is visible when the component is mounted to a mounting surface (e.g., a printed circuit board). This visible edge surface of the terminal may be exposed proximate the side surface of the substrate. For example, the visible edge surface may be approximately aligned (e.g., approximately co-planar) with a side surface of the substrate, which may define a portion of a side surface of the component. When the component is mounted to the mounting surface, for example, by soldering, the quality of the solder connections between the terminal and the mounting surface may be visually inspected. For example, a solder fillet may be formed between the mounting surface and the visible edge surface. The solder fillet may be visually inspectable because the visible edge surface is exposed (e.g., not hidden beneath the component).

In some embodiments, one or more layers or coatings (e.g., protective coatings) may be formed over the substrate such that the substrate does not precisely define the side surface of the component. Thus, it should be understood that, in some embodiments, the visible edge surface may not be precisely aligned with the side surface of the component or substrate. In some embodiments, the visible edge surface may be offset slightly outward (e.g., in an X-direction) from the side surface of the substrate and/or component. Such a location may provide improved visibility of the edge surface. For example, additional terminal material (e.g., the second and/or third layers of the termination described below with reference to FIGS. 1 through 4B) may be deposited after the components are diced, such that the terminal extends at least partially beyond the side surface of the substrate.

The proximity or alignment between the visible edge surface and the side surface of the component may be defined by an offset distance in a direction that is perpendicular to the side surface of the substrate (e.g., the X-direction). More specifically, the offset distance may be defined as the distance that the visible edge surface protrudes outward in the X-direction beyond the side surface of the component. In some embodiments, the offset distance may be approximately equal to the thickness in the Z-direction of any additional layers formed over the first layer (e.g., the second and/or third layer) of the terminal. In some embodiments, the offset distance may range from about 0 microns to about 50 microns, in some embodiments from about 2 microns to about 40 microns, in some embodiments from about 3 microns to about 30 microns, in some embodiments from about 10 microns to about 20 microns.

Regardless, the terminal may be configured and arranged such that at least a portion of the edge surface of the terminal may visible from a suitable vantage point for inspecting the quality of a solder connection between the terminal and the mounting surface once the component is mounted to the mounting surface.

The visible edge surface of the terminal may have a dimension in the Z-direction equal to the thickness of the terminal. In other words, the entire thickness of the terminal may be exposed as the visible edge surface. The thickness of the terminal may be sufficiently large such that the solder connected to the visible edge surface can be quickly visually inspected, for example as described above. For example, in some embodiments the thickness of the terminal and/or length of the visible edge surface in the Z-direction may range from about 25 microns to about 300 microns, or greater, in some embodiments, about 40 microns to about 250 microns, in some embodiments from about 50 microns to about 200 microns, in some embodiments from about 75 microns to about 180 microns, in some embodiments from about 100 microns to about 175, e.g., about 150 microns.

The thickness of the terminal may be selected such that the edge surface is sufficiently large surface for visual inspection.

According to aspects of the present disclosure, the component may be robust against stresses in the component (e.g., thermal stress and/or stress from bending or flexing of the component). For example, a large connection area may be formed between the terminal and the contact pad such that disconnection between the terminal and contact pad is prevented from thermal or mechanical stresses. More specifically, in some embodiments, the terminal may be electrically connected with the contact pad at a connection area that is parallel with the top surface of the substrate (e.g., in an X-Y plane). This configuration may provide a larger connection area than configurations in which an internal element layer is connected along an end face of the internal element layer with the termination (e.g., solely in an X-Z plane).

The element layer (which may include the thin-film element and contact pad) may be formed on the top surface of the substrate. The contact pad may be formed such that an edge of the contact pad is aligned with an edge of the substrate between the side surface and top surface of the substrate. In other words, the contact pad may extend along the top surface of the substrate to the side surface of the substrate. The terminal may then be formed on the contact pad. The connection area between the terminal and the contact pad may be defined in an X-Y plane (e.g., a plane that is parallel to the top surface of the substrate). This connection area may be controlled by controlling the dimensions of the contact pad and/or the size of an exposed portion of the contact pad during electroplating.

In some embodiments, the terminals of the component may have relatively large surfaces for mounting to the mounting surface (e.g., a PCB). The terminals may be elongated in the X-direction to provide additional area for mounting to the mounting surface. For example, a length of one or more of the terminals in the X-direction may range from about 100 microns to about 600 microns, in some embodiments from about 200 microns to about 500 microns, in some embodiments from about 250 microns to about 400 microns, e.g., about 350 microns. A ratio of the length of the terminal to an overall length of the component in the X-direction may be less than about 10, in some embodiments less than about 7, in some embodiments less than about 5, and in some embodiments less than about 3.

The terminals may define top surfaces that extend in the Z-direction beyond an outer surface of the component by a mounting height distance that ranges from about 10 microns to about 120 microns, in some embodiments from about 20 microns to about 100 microns, and in some embodiments from about 30 microns to about 70 microns. The terminals may extend in the Z-direction beneath the outer surface of the component by an internal distance that ranges from about 5 microns to about 50 microns, in some embodiments from about 7 microns to about 40 microns, in some embodiments from about 10 microns to about 30 microns.

The component may range in size. For example, in some embodiments, the component may have an overall length (e.g., in the X-direction) that ranges from about 0.1 mm, or less, to about 5 mm, in some embodiments from about 0.5 mm to about 4 mm, and in some embodiments from about 1 mm to about 3 mm. The component may have an overall width (e.g., in the Y-direction) that ranges from about 0.05 mm to about 3 mm, in some embodiments from about 0.2 mm to about 2 mm, and in some embodiments from about 0.5 mm to about 1.5 mm.

As noted above, in some embodiments the component may include one or more passivation layers. In some embodiments, the passivation layer may be applied over the element layer. The passivation layer may cover the thin-film element but leave some or all of the contact pad exposed for electroplating. For example, in some embodiments, the passivation layer may include a cut-out region that is open to the side surface of the substrate. The cut-out region may be aligned over some or all of the contact pad such that at least a portion of the contact pad is exposed during the deposition process (e.g., electroplating) that is used to form the terminals. However, the passivation layer may cover and protect the thin-film element from the deposition process (e.g., electroplating) that is used to form the terminals.

In some embodiments, a protective layer may be applied over the passivation layer. The protective layer may have a thickness ranging from about 5 microns to about 25 microns. The protective layer may define cut-out regions that at least approximately align with cut-out regions of the passivation layer. In some embodiments, multiple protective layers may be employed. The protective layer(s) may include polyimide, silicon oxynitride, $Al_2O_3$, $SiO_2$, $Si_3N_4$, benzocyclobutene (BCB), epoxy, glass, or another suitable material.

Figure 2:
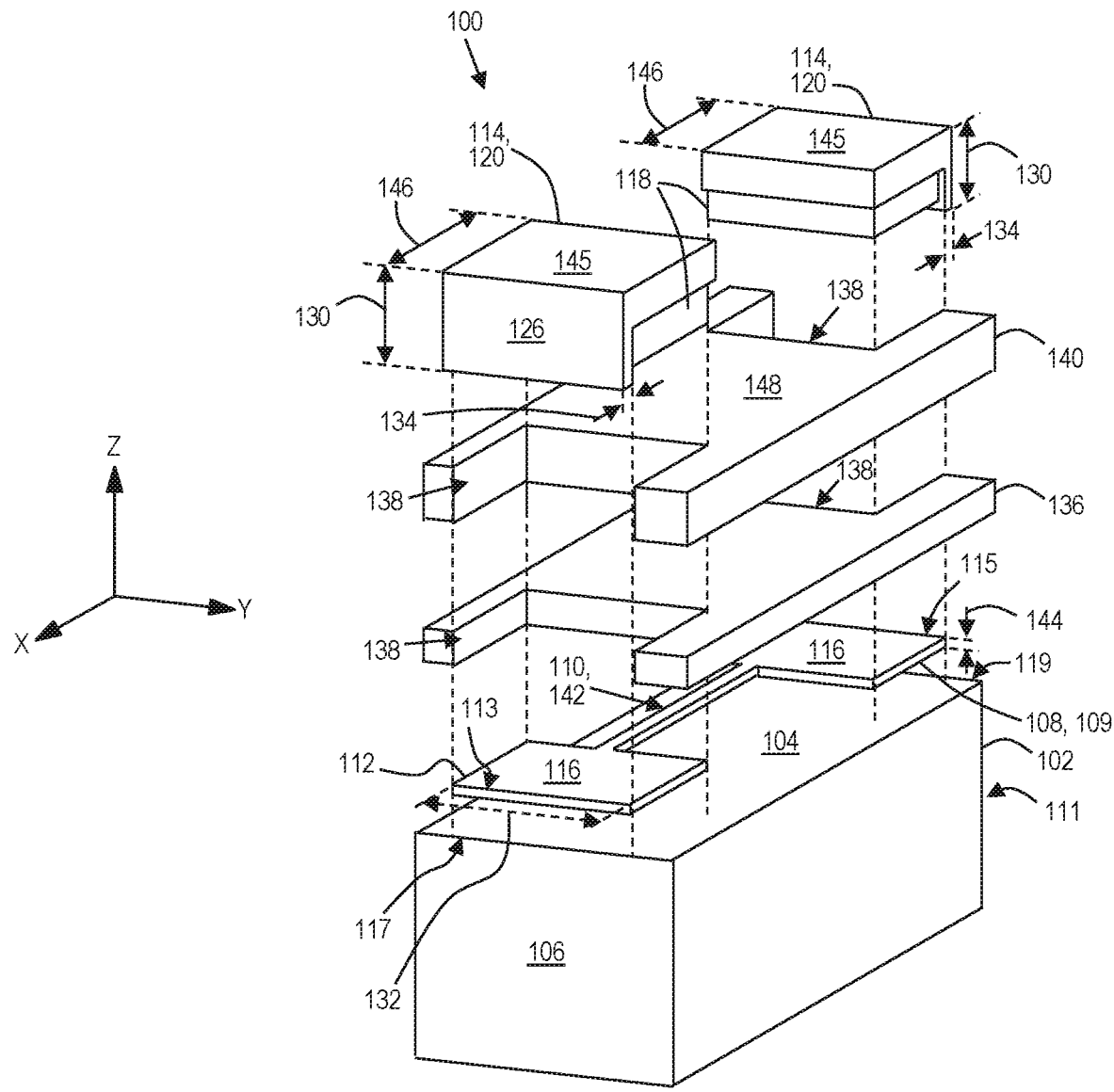
FIG. 2 illustrates an exploded perspective view of the embodiment of the surface-mountable component of FIG. 1, according to aspects of the present disclosure.
Figure 3:
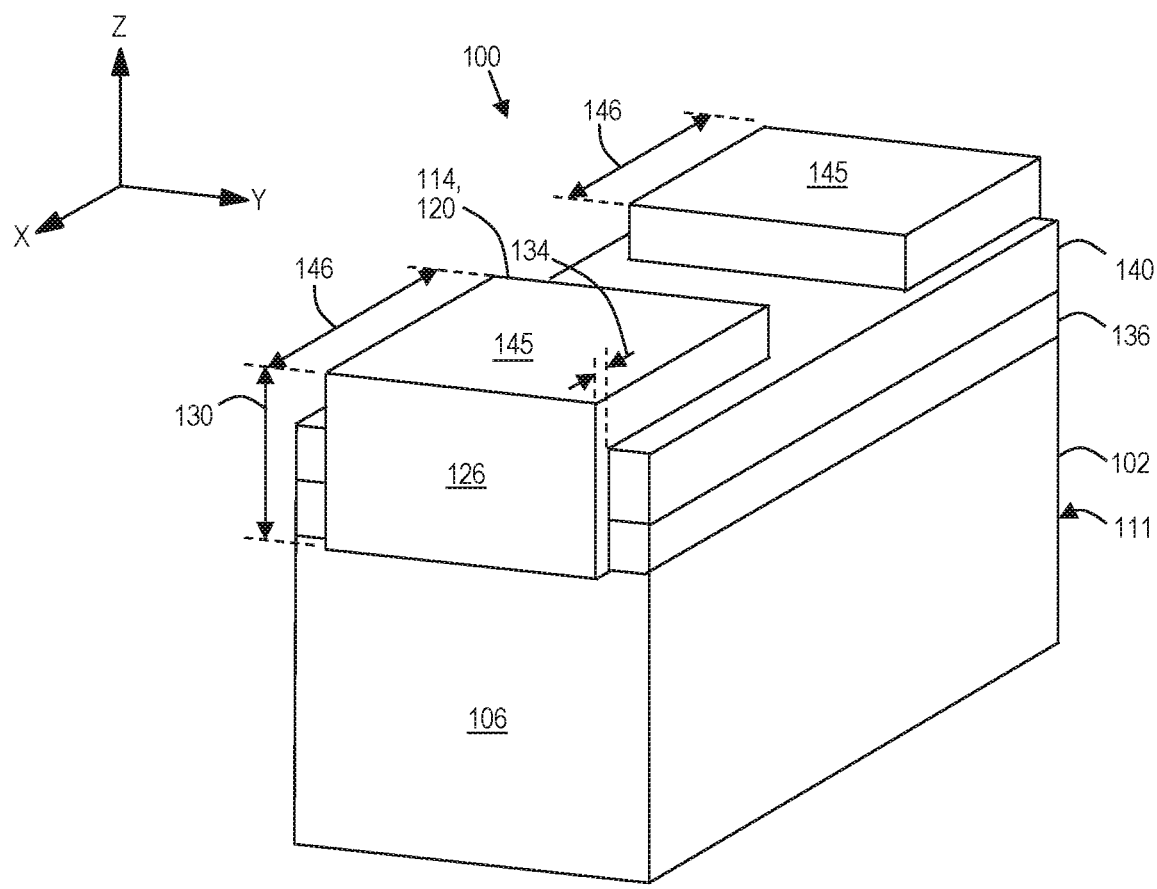
FIG. 3 illustrates a perspective view of the embodiment of the surface-mountable thin-film component of FIG. 1, according to aspects of the present disclosure.
Figure 4:
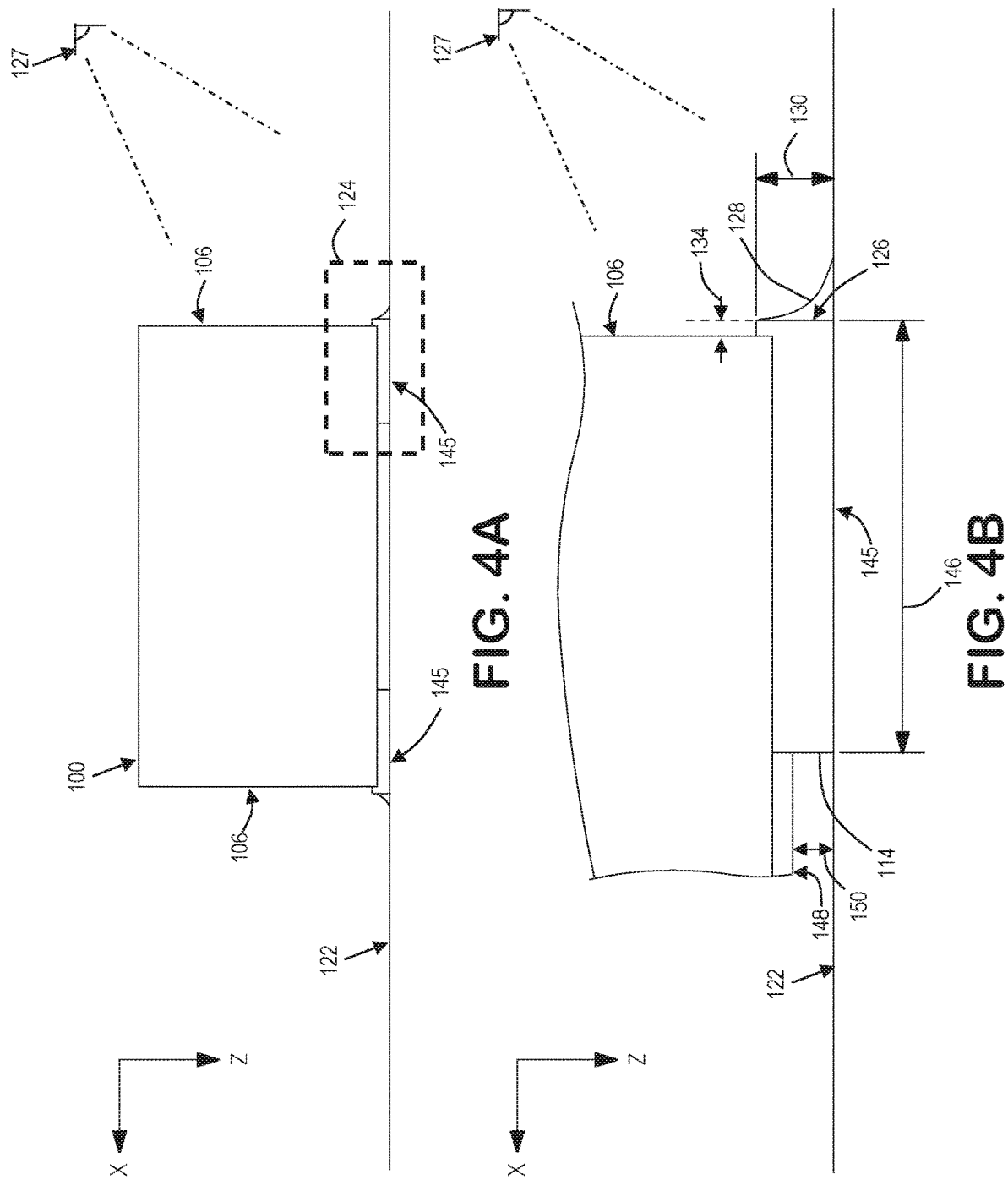
FIG. 4A illustrates a side elevation view the embodiment of the surface-mountable thin-film component of FIG. 1 mounted to a mounting surface.
FIG. 4B illustrates an enlarged view of a portion of FIG. 4A.

Referring now to the drawings, FIGS. 1, 2, and 3 illustrate a cutaway perspective view, exploded perspective view, and regular perspective view of an embodiment of a surface-mountable component 100 according to aspects of the present disclosure. Referring to FIG. 2, the component 100 can include a substrate 102. The substrate can have a top surface 104 and at least one side surface 106. An element layer 108 may be formed on the top surface 104 of the substrate 102. The element layer 108 may include a thin-film element 110 and one or more contact pads 112. The contact pad 112 may extend along the top surface 104 of the substrate 102 in the Y-direction to the side surface 106 of the substrate 102. The contact pad 112 may include an edge 113 that is aligned with an edge 117 of the substrate 102 that is formed between the side surface 106 and top surface 104 of the substrate 102. It should be understood that the contact pad 112 may have any suitable shape, including rectangular square, triangular, circular, etc.

In some embodiments, a second contact pad 109 may extend to a second side surface 111 (not visible in FIG. 2) of the substrate 102. The second side surface 111 of the substrate 102 may be opposite the (first) side surface 106. The second contact pad 109 may have an edge 115 that is approximately aligned with an edge 119 of the substrate 102 that is formed between the second side surface 111 and top surface 104 of the substrate 102.

One or more terminals 114 may be formed on the contact pads 112, for example using electroplating. A connection area may be defined between the terminal 114 and the contact pad 109 an X-Y plane (e.g., a plane that is parallel to the top surface 104 of the substrate 102). During manufacturing, a size of this connection area 116 may be controlled by controlling the dimensions of the contact pad 112 and/or the size of an exposed portion of the contact pad 112 during electroplating.

In some embodiments, the terminals 114 may include a first layer 118 of a conductive material. The first layer 118 of conductive material (e.g., copper). In some embodiments, the terminal 114 may include one or more additional layers 120 formed over the first layer 118. The additional layer 120 may comprise a solderable conductive material. In some embodiments, the additional layers 120 may include a second layer of nickel and a third layer of tin. However, the second and/or third layers may include tin, nickel, lead, or mixtures thereof. In other embodiments, however, the terminals 114 may be free of any additional layers 120 formed over the first layer 118. For example, in such embodiments, each terminal 114 may consist of the first layer 118.

The terminals 114 may define visible edge surfaces 126 that are visible when the component 100 is mounted to a mounting surface. FIG. 4A illustrates the component 100 of FIGS. 1-3 mounted to a mounting surface 122. FIG. 4B illustrates an enlarged view of the portion of FIG. 4A within the dashed box 124. When the component 100 is mounted to the mounting surface 122, for example, by soldering, visible edge surface 126 may not be hidden beneath the component 100 such that the quality of the solder connections between the terminal 114 and the mounting surface may be visually inspected (represented by viewing eye 127). For example, referring to FIG. 4B, a solder fillet 128 may be formed between the mounting surface 122 and the visible edge surface 126.

The visible edge surface 126 of the terminal 114 may have an exposed length in the Z-direction. The exposed length may be equal to a thickness 130 of the terminal. In other words, the entire thickness 130 of the terminal 114 may be exposed as the visible edge surface 126. The thickness 130 of the terminal 114 may be sufficiently large such that the solder connected to the visible edge surface 126 can be quickly visually inspected, for example as described above.

The terminal 114 may be arranged such that the edge surface 126 is visible. The visible edge surface 126 of the terminal 114 may be aligned or approximately aligned with the side surface 106 of the substrate 102 in a Y-direction along a width 132 of the contact pad 112. As noted above, the side surface 106 of the substrate 102 may generally define a side surface of the component 100. Thus, in some embodiments, the visible edge surface 126 may be aligned or approximately aligned with the side surface 106 of the component 100. However, in some embodiments, one or more layers or coatings (e.g., protective coatings) may be formed over the substrate 102 such that the substrate 102 does not precisely define the side surface 106 of the component 100. Additionally, in some embodiments, the visible edge surface 126 may be located slightly outward (in the X-direction) relative to the side surface 106 of the substrate 106 and/or a side surface of the component 100. For example, the terminal 114 may extend beyond the side surface 106 of the substrate 102 by an offset distance 134. In some embodiments, the offset distance may be approximately equal to a thickness of the additional layers 120 of the terminal 114.

Referring again to FIG. 2, in some embodiments, a passivation layer 136 may be formed over at least a portion of the element layer 108. The passivation layer 136 may be applied over the element layer 108. The passivation layer 136 may cover the thin-film element 110 but leave some or all of the contact pad 112 exposed for electroplating.

For example, in some embodiments, the passivation layer 136 may include a cut-out region 138 that is open to the side surface 106 of the substrate 102. The cut-out region 138 may be aligned over some or all of the contact pad 112 such that at least a portion of the contact pad 112 is exposed during the deposition process (e.g., electroplating) that is used to form the terminals 114. The passivation layer 136 may cover and protect the thin-film element 110 from the deposition process (e.g., electroplating) that is used to form the terminals 114.

It should be understood that, in some embodiments, a portion of the passivation layer 136 may cover a portion of the contact pad 112. For example, edges of the cut-out regions 138 may not necessarily be perfectly aligned with edges of the contact pads 112. Additionally, in some embodiments, the passivation layer 136 may be used to cover a portion of the contact pad 112 such that the terminal 114 is only formed on the exposed portion of the contact pad 112.

In some embodiments, a protective layer 140 may be applied over the passivation layer 136. The protective layer 140 may have a thickness ranging from about 5 microns to about 25 microns. The protective layer may define cut-out regions that at least approximately align with cut-out regions of the passivation layer. In some embodiments, multiple protective layers may be applied. The protective layer(s) may include polyimide, silicon oxynitride, $Al_2O_3$, $SiO_2$, $Si_3N_4$, benzocyclobutene (BCB), epoxy, glass, or another suitable material.

As one example, the passivation layer may be or include silicon oxynitride. The protective layer may be formed over the passivation layer and may be or include polyimide.

The thin-film element 110 may be or include at least one of a filter, inductor, coupler, resistor, or a fuse. For example, in some embodiments, the thin-film element 110 may be or include a thin-film fuse that includes a fuse track 142. The fuse track 142 may be connected between a pair of the terminals 114. Each of the terminals 114 may be disposed proximate a respective opposite side face 106 of the substrate 102. In some embodiments, the fuse track 142 may be generally straight, for example as illustrated in FIGS. 1 and 2. It should also be appreciated, however, that other configurations are possible, for example, where additional length is required or desirable. As examples, in some embodiments, the fuse track may be curved, may have a zig-zag shape, or may have a sinusoidal shape.

The fuse track 142 may have a length in the X-direction (e.g., between the contact pads 112). The fuse track 142 may have a thickness in the Z-direction that corresponds with a thickness 144 of the element layer 108. The dimensions of the fuse track 142 may be selected to provide performance characteristics desired of the component 100.

The terminals 114 may have top surfaces 145 for mounting to the mounting surface 122 (FIGS. 4A and 4B). The top surfaces 145 may have relatively large areas to improve the mechanical connection (e.g., by soldering) between the top surfaces 145 of the terminals 114 and the mounting surface 122. For example, the terminals 114 may have a length 146 in the X-direction suitable for providing large top surfaces 145 for mounting the component 100 to the mounting surface 122.

The top surfaces 145 of the terminals 114 may extend in the Z-direction beyond an outer surface 148 of the component 100 by a mounting height distance 150 (illustrated in FIGS. 1 and 4B). The terminals 114 may extend in the Z-direction beneath the outer surface 148 of the component by an internal distance 152.

Additionally, although the element layer 108 has generally been described and illustrated as a single layer, it should be understood that multiple element layers may be provided to form thin-film structures, such as a filter, inductor, coupler, or any other suitable thin-film structure within the scope of this disclosure. In such embodiments, an additional dielectric layer may be formed over the additional element layer, for example as an "isolation" layer. The additional element layer may be formed over the additional dielectric layer and may be electrically connected with the (first) element layer 108 to form a circuit (e.g., a filter) using suitable vertical connection structures (e.g., vias). In some embodiments, the component 100 may include more than two element layers, (which may be separated by respective dielectric layers) to form more complex components. Additional passivation layers may also be employed.

Figure 5:
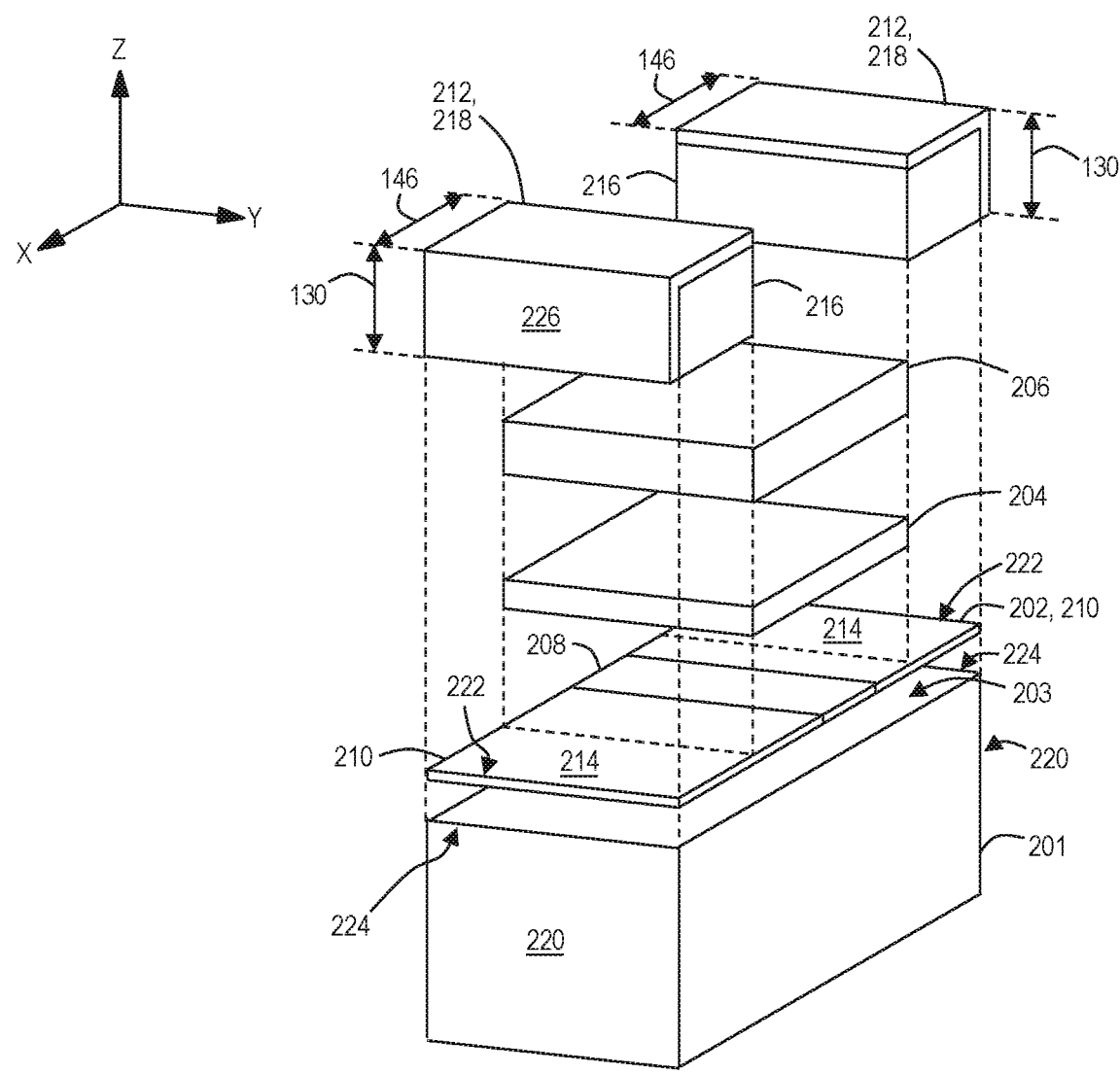
FIG. 5 illustrates a cutaway perspective view of another embodiment of a surface-mountable thin-film component, according to aspects of the present disclosure.
Figure 6:
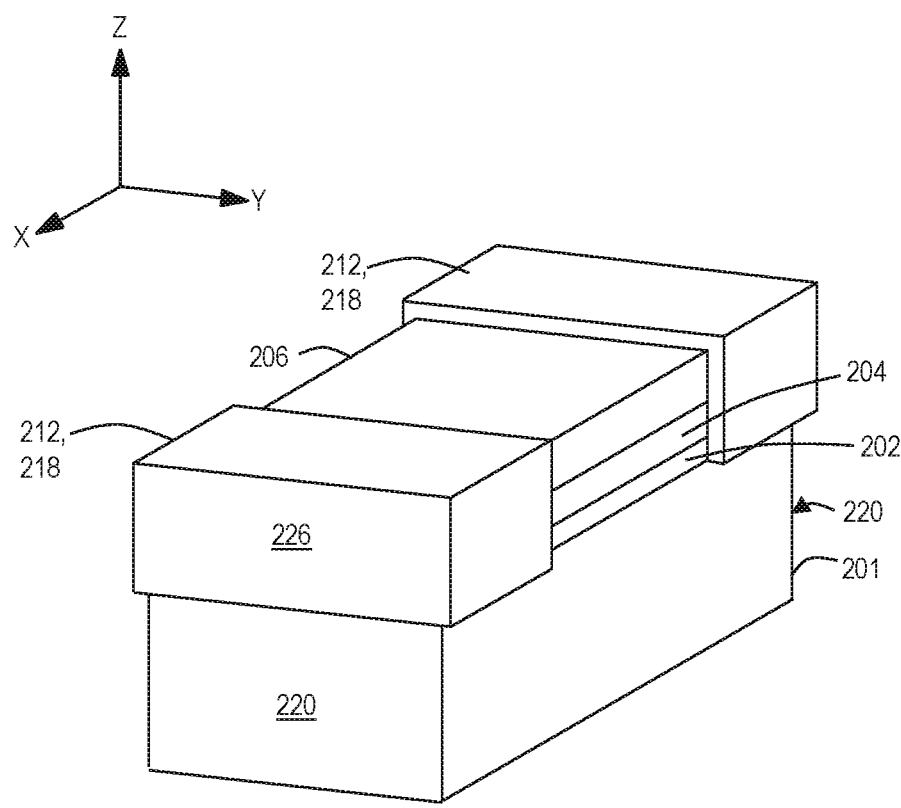
FIG. 6 illustrates a perspective view of the embodiment of the surface-mountable thin-film component of FIG. 5, according to aspects of the present disclosure.

FIG. 5 illustrates a perspective view of another embodiment of a thin-film, surface-mount component 200 according to aspects of the present disclosure. The component 200 may include a substrate 201, an element layer 202, and a passivation layer 204. The component 200 may also include one or more protective layer(s) 206. The element layer 202 may be arranged on a top surface 203 of the substrate 201. The element layer 202 may include a thin-film element 208 and one or more contact pads 210. The passivation layer 204 and/or protective layer(s) 206 may cover the thin film element 208 and portions of the contact pads 210. The terminals 212 may be formed on portions 214 of the contact pads that are not covered by the passivation layer 204 and/or protective layer(s) 206. The terminals may include respective first layers 216. Additional layers 218 (e.g., second and/or third layers) may optionally be formed over the first layer 216. Thus, in this embodiment of the component 200, the passivation layer 204, and/or protective layer(s) 206 may be free of cut-out regions, which were described above with reference to FIGS. 1 through 4B.

The contact pads 210 and terminals 212 may extend to the side surfaces 220 of the substrate 201, for example as described above with reference to FIGS. 1 through 4B. The contact pads 210 may extend to the side surfaces 220 in the X-direction. Edges 222 of the contact pads 210 may be approximately aligned with edges 224 of the substrate that are formed between the top surface 203 and the side surfaces 220. The terminals 212 may have visible edge surface 226, for example as described above with reference to FIGS. 1 through 4B.

As noted above, the thin-film element 208 may be or include any suitable type of the thin-film element, including a filter, inductor, coupler, resistor, or a fuse. For example, in some embodiments, the thin-film element 208 may include a layer of resistive material connected between the contact pads 210. Although shown as co-planar, it should be understood that the layer of resistive material of the thin-film element 208 may partially overlap one or both contact pads 210.

Additionally, although the element layer 202 has generally been described and illustrated as a single layer, it should be understood that multiple element layers may be provided to form thin-film structures for a filter, inductor, coupler, resistor, fuse, etc., within the scope of this disclosure. In such embodiments, an additional element layer may be formed over the passivation layer. An additional isolation and/or dielectric layer may be formed over the additional element layer. The additional element layer may be electrically connected with the (first) element layer 202 to form a circuit (e.g., a filter) using suitable vertical connection structures (e.g., vias). In some embodiments, the component 200 may include more than two element layers, (which may be separated by respective dielectric and/or isolation layers) to form more complex components.

Although the terminals have been described and illustrated in pairs, it should also be understood that the component may have a single terminal or may have more than two terminals, in accordance with aspects of the present disclosure. Additionally, in some embodiments the component may include one or more terminals having a visible edge surface and one or more terminals that do not include a visible edge surface.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A surface-mountable component comprising:
   a substrate having a side surface and a top surface that is perpendicular to the side surface;
   an element layer formed on the top surface of the substrate, wherein the element layer comprises a thin-film element and a contact pad electrically connected with the thin-film element, the contact pad extending to the side surface of the substrate;
   a terminal electrically connected with the contact pad at a connection area that is parallel with the top surface of the substrate, and wherein the terminal has a visible edge surface that is approximately aligned with the side surface of the substrate; and
   at least one of a protective layer or a passivation layer formed over the thin-film element, wherein the at least one of the protective layer or the passivation layer is open to the side surface of the substrate.

2. The surface-mountable component of claim 1, wherein the visible edge surface is visible for inspection when the surface-mountable component is mounted to a mounting surface.

3. The surface-mountable component of claim 1, wherein the visible edge surface has an exposed length in a Z-direction that is greater than about 25 microns, the Z-direction being perpendicular to the top surface of the substrate.

4. The surface-mountable component of claim 1, wherein the terminal has a thickness in a Z-direction that is greater than about 25 microns, the Z-direction being perpendicular to the top surface of the substrate.

5. The surface-mountable component of claim 1, wherein an offset distance between the visible edge surface of the terminal and the side surface of the substrate ranges between about 0 microns and about 50 microns.

6. The surface-mountable component of claim 1, wherein the terminal is formed on top of at least a portion of the contact pad in a Z-direction that is perpendicular to the top surface of the substrate.

7. The surface-mountable component of claim 1, wherein the terminal has a length in an X-direction that is greater than about 100 microns, the X-direction being perpendicular to the side surface of the substrate.

8. The surface-mountable component of claim 1, wherein the thin-film element comprises at least one of a strip line, capacitor, inductor, coupler, resistor, or fuse.

9. The surface-mountable component of claim 1, wherein the surface-mountable component comprises an additional contact pad formed on the top surface of the substrate, the additional contact pad extending to an additional side surface of the substrate that is opposite the side surface of the substrate.

10. The surface-mountable component of claim 9, wherein the thin-film element is electrically connected with each of the contact pad and the additional contact pad.

11. The surface mountable component of claim 1, wherein the thin-film element has a thickness in a Z-direction that ranges from about 0.1 microns to about 8 microns, the Z-direction being perpendicular to the top surface of the substrate.

12. The surface-mountable component of claim 1, wherein the thin-film element comprises a fuse track.

13. The surface-mountable component of claim 1, wherein the contact pad is integrally formed the thin-film element.

14. The surface-mountable component of claim 1, wherein the surface-mountable component comprises a passivation layer formed over the thin-film element.

15. The surface mountable component of claim 14, wherein the passivation layer comprises at least one of silicon oxynitrde or polyimide.

16. The surface mountable component of claim 14, wherein the surface mountable component comprises a protective layer formed over the passivation layer.

17. The surface mountable component of claim 16, wherein the protective layer comprises at least one of polyimide, benzocyclobutene (BCB), or epoxy.

18. The surface mountable component of claim 14, wherein the passivation layer comprises at least one of polyimide, silicon oxynitride, Al2O3, SiO2, Si3N4, benzocyclobutene, or glass.

19. The surface mountable component of claim 14, wherein an adhesive layer is deposited between the thin-film element and the passivation layer.

20. The surface mountable component of claim 19, wherein the adhesive layer comprises at least one of Ta, Cr, Ti, or TiW.

21. The surface mountable component of claim 1, wherein the terminal comprises a first layer in contact with the contact pad and a second layer over the first layer, wherein the first layer comprises copper, and wherein the second layer comprises at least one of tin or nickel.

22. The surface mountable component of claim 1, wherein the substrate comprises at least one of sapphire, silicon oxide, or glass.

23. The surface mountable component of claim 1, wherein the surface mountable component comprises an additional element layer, the surface mountable component being configured as a filter.

24. A method for forming a surface-mountable component, the method comprising:
    providing a substrate having a side surface and a top surface that is perpendicular to the side surface;
    depositing an element layer on the top surface of the substrate, wherein the element layer comprises a thin-film element and a contact pad electrically connected with the thin-film element, the contact pad extending to the side surface of the substrate;
    forming at least one of a protective layer or a passivation layer over the thin-film element, wherein the at least one of the protective layer or the passivation layer is open to the side surface of the substrate; and
    electroplating at least a portion of the contact pad to form a terminal having a connection area with the contact pad that is parallel with the top surface of the substrate and such that the terminal has a visible edge surface that is approximately aligned with the side surface of the substrate to form a terminal.

25. The method of claim 24, wherein electroplating the at least a portion of the contact pad comprises electroplating a first layer of copper on the at least a portion of the contact pad and electroplating a second layer over the first layer, the second layer comprising at least one of tin or nickel.

* * * * *